(12) United States Patent
Bottcher et al.

(10) Patent No.: US 12,273,993 B2
(45) Date of Patent: Apr. 8, 2025

(54) METHOD FOR PRODUCING A CARRIER ARRANGEMENT

(71) Applicant: Fraunhofer-Gesellschaft zur Förderung der angewandten Forschung e.V., Munich (DE)

(72) Inventors: Mathias Bottcher, Moritzburg (DE); Frank Windrich, Moritzburg (DE); Kai Zoschke, Berlin (DE); M. Jürgen Wolf, Moritzburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/604,057

(22) Filed: Mar. 13, 2024

(65) Prior Publication Data

US 2024/0224417 A1 Jul. 4, 2024

Related U.S. Application Data

(63) Continuation of application No. 17/310,398, filed as application No. PCT/EP2020/052491 on Jan. 31, 2020, now abandoned.

(30) Foreign Application Priority Data

Jan. 31, 2019 (DE) .................... 10 2019 201 281.7

(51) Int. Cl.
*H05K 3/46* (2006.01)
*H05K 1/02* (2006.01)

(52) U.S. Cl.
CPC ......... *H05K 1/0278* (2013.01); *H05K 3/4691* (2013.01); *H05K 2201/09109* (2013.01)

(58) Field of Classification Search
CPC ............... H05K 1/0278; H05K 3/4691; H05K 2201/09109; H05K 1/189;
(Continued)

(56) References Cited

U.S. PATENT DOCUMENTS 8,591,692 B2 11/2013 Wang et al.
8,758,983 B2 * 6/2014 Sirringhaus .......... H10K 71/221
430/311
(Continued)

FOREIGN PATENT DOCUMENTS

DE 102008028300 A1 12/2009
DE 102008029300 A1 12/2009
(Continued)

OTHER PUBLICATIONS

"U.S. Appl. No. 17/310,398 Preliminary Amendment filed Jul. 30, 2021", 7 pgs.
(Continued)

*Primary Examiner* — Donghai D Nguyen
(74) *Attorney, Agent, or Firm* — Schwegman Lundberg & Woessner, P.A.

(57) ABSTRACT

The invention relates to a carrier arrangement (100; 500; 600; 700; 800; 900; 1000), and a method for producing a carrier arrangement. The method comprises:
producing a layer (130; 530; 630; 730; 830; 930; 1030) on a surface (120; 520; 620; 720; 820; 920; 1020) of a carrier (110; 510; 610; 710; 810; 910; 1010), the layer comprising a first region (131; 531; 631; 731; 831; 931; 1031) and a second region (132; 532; 632; 732; 832; 932; 1032) connected to the first region, the first region covering a first surface region (121; 521; 621; 721; 821; 921; 1021) of the carrier and the second region covering a second surface region (122; 722; 922) of the carrier, (Continued)

detaching the second region of the layer from the carrier, the first region of the layer remaining on the first surface region of the carrier and not being separated from the second region, the layer being flexible in the detached second region.

18 Claims, 7 Drawing Sheets

(58) Field of Classification Search
CPC .......... H05K 2203/308; H01L 23/5385; Y10T 29/49128; Y10T 29/49155
See application file for complete search history.

(56) References Cited

U.S. PATENT DOCUMENTS

| | | | |
|---|---|---|---|
| 9,119,335 | B2 | 8/2015 | Chisaka |
| 10,470,304 | B2 * | 11/2019 | Cotton .................. H05K 1/144 |
| 10,749,139 | B2 * | 8/2020 | Lee ...................... H10K 77/111 |
| 2007/0215378 | A1 | 9/2007 | Kasahara et al. |
| 2008/0137317 | A1 | 6/2008 | Worl et al. |
| 2022/0095450 | A1 | 3/2022 | Bottcher et al. |

FOREIGN PATENT DOCUMENTS

| | | |
|---|---|---|
| FR | 2754416 A1 | 4/1998 |
| JP | 2003264369 | 9/2003 |
| JP | 2004207490 | 7/2004 |
| JP | 2011523223 | 8/2011 |
| WO | 2011062146 | 5/2011 |

OTHER PUBLICATIONS

"U.S. Appl. No. 17/310,398, Non Final Office Action mailed May 11, 2023", 10 pgs.

"U.S. Appl. No. 17/310,398, Notice of Allowance mailed Dec. 15, 2023", 9 pgs.

"U.S. Appl. No. 17/310,398, Response filed Feb. 27, 2023 to Restriction Requirement mailed Dec. 30, 2022", 9 pgs.

"U.S. Appl. No. 17/310,398, Response filed Sep. 11, 2023 to Non Final Office Action mailed May 11, 2023", 11 pgs.

"U.S. Appl. No. 17/310,398, Restriction Requirement mailed Dec. 30, 2022", 7 pgs.

"Chinese Application Serial No. 202080023814.0, Office Action dated Apr. 26, 2023", w/ English Translation, (Apr. 26, 2023), 23 pgs.

"International Application Serial No. PCT/EP2020/052491, International Search Report mailed May 19, 2020", w/ English Translation, (May 19, 2020), 6 pgs.

"International Application Serial No. PCT/EP2020/052491, Written Opinion mailed May 19, 2020", (May 19, 2020), 9 pgs.

Chow, Eugene M., et al., "Wafer-level packaging with soldered stress-engineered micro-springs", IEEE Transactions on Advanced Packaging 32.2, (2009), pp. 372-378.

"Japanese Application No. 2021-544355, Office Action dated Mar. 5, 2024", w English Translation, (Mar. 5, 2024), 22 pgs.

* cited by examiner

Fig. 9

METHOD FOR PRODUCING A CARRIER ARRANGEMENT

PRIORITY APPLICATIONS

This application is a continuation of U.S. Ser. No. 17/310,398, filed Jul. 30, 2021, which is a U.S. National Stage Filing under 35 U.S.C. § 371 from International Application No. PCT/EP2020/052491, filed on Jan. 31, 2020, and published as WO2020/157314 on Aug. 6, 2020, which claims the benefit of priority to German Application No. 10 2019 201 281.7, filed on Jan. 31, 2019; the benefit of priority of each of which is hereby claimed herein, and which applications and publication are hereby incorporated herein by reference in their entireties.

The invention relates to a carrier arrangement and a production method for a carrier arrangement. The invention relates particularly to carrier arrangements for microsystems.

A carrier arrangement of the type described herein can be, for example, a microsystem or part of a microsystem and, for example, be configured for microelectronic, micromechanical, microfluidic and/or electro-optical applications. The carrier arrangement has at least one carrier, for example, a substrate made of silicon or another suitable material, on which interfaces and/or lines for signal transmission between microelectronic, micromechanical, microfluidic and/or micro-optical components can be arranged. The carrier arrangement can, for example, mechanically connect such components to one another and/or itself have such assemblies or components. The carrier arrangement typically has regions which differ from one another in terms of their flexibility.

For example, carrier arrangements are known from circuit board technology in which one or more flexible foils are arranged on a relatively rigid carrier and are used particularly as connecting lines to subassemblies, sensors or plug connectors. Typically for this purpose, flexible foils that are prepared, already structured and provided with conductor tracks are placed in a laminate stack on the rigid carrier and pressed together therewith to form a rigid-flexible composite, often also referred to as a rigid-flex composite. The performance of this so-called rigid-flex technology corresponds to the technical possibilities of conventional circuit board technology and is typically limited to conductor track widths of at least 50 µm.

Furthermore, production processes for Si chips are known in which a carrier made of silicon is first glued with the contact side onto a polymer film. By means of laser or plasma processes, foil and adhesive are then removed in the region of the contact points; the surface of the carrier is cleaned and metallized over the entire surface, for example, by sputtering or wet-chemically. Furthermore, the line pattern is transferred to the surface by means of photolithography and the conductor tracks are generated using known methods. This method allows direct bonding of Si chips, but has the disadvantage that, on the one hand, relatively large regions are necessary for bonding and, on the other hand, the use of adhesives can limit temperature stability.

In principle, the object is therefore to simplify the production of carrier arrangements, particularly carrier arrangements of the type described above. The method should be as versatile as possible with regard to the possible geometric configuration and with regard to the functional properties of the carrier arrangement. In addition, it should be possible to produce carrier arrangements that are as compact as possible. For example, the best possible temperature resistance and the highest possible chemical stability of the carrier arrangement are also desirable.

In order to achieve the object, according to the invention, particularly, a production method according to the main claim and a carrier arrangement according to the further independent patent claim and also a microsystem having such a carrier arrangement are proposed. Further developments and special embodiments emerge from the dependent claims and from the preceding and following description and the figures. For example, the proposed carrier arrangement and the proposed microsystem may have been produced using the production method proposed here. Particularly, all the features described in connection with the method can therefore also be correspondingly transferred to the carrier arrangement and the microsystem. Conversely, all the features described in connection with the carrier arrangement or the microsystem can also be transferred to the production method.

The method proposed here for producing a carrier arrangement comprises, for example, the following steps:

producing at least one layer on a surface of at least one carrier, wherein the at least one layer comprises at least one first region and at least one second region connected to the at least one first region, wherein the at least one first region covers at least one first surface region of the at least one carrier and the at least one second region covers at least one second surface region of the at least one carrier, completely or at least partially detaching or releasing the at least one second region of the at least one layer from the at least one carrier. For example, the at least one second region of the at least one layer is detached from the at least one second surface region of the at least one carrier. Typically, however, the at least one first region of the layer remains on the at least one first surface region of the carrier and is typically not separated from the at least one second region of the layer.

The detachment can take place mechanically, for example, in that, for example, the second region of the layer is wholly or partially peeled off the carrier. Additionally or alternatively, the second region of the layer can be detached or released chemically, for example, by locally removing the carrier by etching, for example, at least those regions of the carrier which form the second surface region of the carrier. Additionally or alternatively, the detachment can take place by means of electromagnetic radiation, for example, by irradiating a contact area, also known as the adhesion area, adhesion interface or bond interface, between the second region of the layer and the second surface region of the carrier by means of electromagnetic radiation, for example, laser radiation, and for example, being completely or partially destroyed. Of course, any combination of these detachment methods is also possible, so that, for example, a second region of the layer is detached mechanically from the carrier, another second region of the layer is detached from the carrier chemically by etching and yet another second region of the layer is detached from the carrier by irradiation. It is also possible that a second region of the layer is first partially removed by means of electromagnetic radiation and then completely removed mechanically (for example, peeled off).

Typically, the at least one layer is flexible, for example, pliable and/or stretchable, at least within the detached at least one second region. For example, it is therefore possible to bend, fold and/or stretch the at least one layer within the detached at least one second region without damaging the layer as a result.

According to the production process, the carrier arrangement proposed here comprises:
- at least one carrier (each) having a surface and
- at least one layer having at least a first region which is arranged on the surface of the at least one carrier and at least one second region which is connected to the at least one first region and is not arranged on the surface of the at least one carrier. As has already been described above, the layer in the at least one (detached) second region is typically flexible, that is, for example, flexible and/or stretchable.

The carrier arrangement has preferably been produced using the method proposed here. The surface of the at least one carrier then comprises the at least one first surface region defined above in connection with the method and the at least one first region of the at least one layer is arranged on the first surface region.

The proposed microsystem comprises at least one carrier arrangement of the type proposed here and at least one component, such as, for example, at least one microelectronic, micromechanical, microfluidic and/or electro-optical component. For example, contact elements and/or lines are arranged on the at least one carrier of the at least one carrier arrangement, which contact elements and/or lines are set up for signal transmission with the component or between the components. The at least one component can be arranged, for example, on the surface of the at least one carrier, particularly on the first surface region, the second surface region or an adjoining further surface region of the carrier. In addition, at least one component can be arranged on the at least one layer or integrated into the at least one layer of the at least one carrier arrangement, particularly in the first region or in the flexible second region detached from the respective carrier. Further examples of components, lines and contact elements are further given below.

The term substrate is also used as a synonym for the term carrier. In addition, the carrier is also referred to as a carrier element. Parts or segments of the carrier can in turn also be referred to as carriers. The phrase "at least one" used above has the usual meaning of "one or more than one". Merely for the sake of better readability, the wording "at least one" (particularly in connection with the carrier, the layer, the first and second region of the layer and the first and second surface region of the carrier) is dispensed with below. Thus, "a" or "an" is to be read as "at least one" and accordingly "the" as "the at least one". For example, in the production method, the at least one layer can be produced on the surface of precisely one carrier (substrate). As will be described in more detail below, the carrier can subsequently be split into segments (without thereby separating the first region of the layer from the second region of the layer) so that the carrier arrangement produced in this way comprises a plurality of carrier segments, that is, a plurality of carriers. These carrier segments are then typically connected to one another by the (not or at least not completely severed) layer.

Typically, said surface of the carrier is flat and thus defines a main plane of the carrier. The first surface region typically adjoins the second surface region of the carrier. In the case of a plurality of first surface regions and/or a plurality of second surface regions, each second surface region typically adjoins at least one (of the) first surface region(s).

The carrier arrangement is, for example, a rigid-flexible system, that is, comprises rigid regions and flexible (bendable and/or stretchable) regions. For example, the carrier can be rigid (that is, mechanically stable and not or hardly flexible or stretchable) and the layer can be flexible at least in the detached second region. As will be described further below, however, it is also possible for the carrier to be semi-rigid or flexible, for example, that is, flexible and/or stretchable, for example, because the carrier is only very thin. Typically, however, the layer in the detached second region is more flexible, that is, particularly more flexible and/or stretchable, than the carrier.

The layer can be designed, for example, in the form of a (thin) foil or a (thin) film. The layer can, for example, have a total thickness between 1 and 300 µm. The total thickness of the layer is preferably between 1 and 100 µm and particularly preferably between 1 and 50 µm. The layer is preferably produced or structured by means of thin film techniques and/or lithographic processes, such as, for example, by means of PVD, CVD, photolithography, laser ablation or other processes, as will be described in more detail below.

In one example (taking advantage of the flexibility or pliability of the layer in the detached second region), the layer is bent or folded within the detached second region. As a result of the bending or folding, a curvature of the layer is produced in the detached second region of the layer which, for example, has a bending radius of at least 50 µm, typically in a region between 50 µm and 40 mm. The layer can thus, for example, assume a non-planar shape in some regions and have a curved region. By bending or folding the layer in the detached second region, the second region of the layer can, for example, be moved out of the above-mentioned main plane of the carrier. For example, a plane defined by the second region of the layer can enclose a non-vanishing angle with a plane defined by the surface of the carrier. The angle can, for example, be in a range between 0° and 180°, for example, between 85° and 95°. Twists (torsions) of the detached second region of the layer are also possible.

The layer can be formed entirely or at least in some regions from a polymer, for example, from polyimide or polybenzoxazole, from a metal, from glass, ceramic or from silicon or from a combination of two or more of these materials. In order to achieve said flexibility, particularly pliability and/or stretchability, of the layer, said layer is typically formed from appropriately flexible materials. However, it is also possible to form the layer from relatively rigid or brittle materials (such as metal, glass, ceramic or silicon) or to integrate such materials into the layer. In this case, however, it must typically be ensured that the layer has a sufficiently small overall thickness or that these relatively rigid or brittle materials only form a sufficiently small part of the overall thickness.

The carrier can, for example, be formed entirely or at least in some regions from silicon, glass, metal, ceramic or a polymer or from a combination of two or more of these materials. For example, the carrier can be a wafer, particularly a silicon wafer, or part of a (silicon) wafer, a plate, such as a glass plate or a glass panel, or a band, for example, a band made of a polymer or a composite material.

The carrier is typically more rigid and therefore less flexible and less pliable than the layer in the detached second region. Bending radii of the carrier that can be achieved by bending the carrier are therefore typically above 50 mm or even above 250 mm (depending on the rigidity of the carrier). As has already been mentioned above, it is also possible, for example, for the carrier to also be relatively flexible and pliable. In order to achieve this, the carrier can be designed to be correspondingly thin, particularly if it is formed from a relatively rigid or brittle material. For example, the total thickness of the carrier can therefore be between 10 and 2000 µm, between 10 and 800 µm or between 10 and 300 µm.

The layer can be multilayered or comprise a plurality of layers or partial layers of the layer arranged one above the other, which can form a flexible (pliable) composite in the detached second region, for example. At least one or more of the partial layers is preferably produced by means of thin film techniques and/or lithographic processes.

The layers or partial layers of the layer can be, for example, insulating layers and/or conductive layers, for example, electrical, optical and/or microfluidic insulating layers and/or electrical, optical and/or microfluidic conductive layers. The insulating and conductive layers are layered alternately on top of each other, for example. For example, the line layer comprises at least one line, for example, at least one conductor track formed from an electrically conductive material, at least one optical line and/or at least one microfluidic channel.

In one example, when producing the layer on the surface of the carrier, for example, at least one (electrical) insulating layer of the layer is formed from an (electrically) insulating material (dielectric), such as, for example, from one of the further polymers described below, particularly polyimides (PI) and polybenzoxazoles (PBO). The at least one insulating layer can cover at least the first surface region and the second surface region of the carrier, for example. For example, a conductive layer is formed on the at least one insulating layer, for example, made of an electrically conductive material. For example, metals such as copper (Cu), aluminum (Al), titanium (Ti) and gold (Au) are used as electrically conductive materials. For example, the at least one line layer comprises at least one continuous line or conductor track which, starting from the first region of the layer, extends into the second region of the layer. The layer can therefore be, for example, a (multilayer) rewiring layer or rewiring film.

For example, the second region detached from the carrier or the second surface region of the carrier can be or is connected to a further carrier of the carrier arrangement. This further carrier can, for example, be designed like the first-mentioned carrier, that is, for example, also be rigid. The embodiments described for the first-mentioned carrier also apply to the further carrier mentioned here. The further carrier typically also has a surface which can be designed flat, for example, and to which the detached second region of the layer can be connected flatly and/or by means of mechanical connection elements or the contact elements already mentioned. This connection can, for example, connected in a force-fitting manner or in a material bonding manner, for example, by means of solder connections. The mechanical connection elements can be, for example, so-called micro-contact elements or micro-solder bumps, bonding wires or plug connection elements.

It is also possible that, before or after the second region of the layer is detached from the second surface region of the carrier, the carrier is severed in the second surface region or between the first surface region and the second surface region, for example, along a cutting plane. Typically, however, the layer is not severed in this case. Particularly, by severing the carrier, the first region and the second region of the layer are typically not separated from one another, but rather remain connected to one another.

For example, it is possible to sever the carrier twice or multiple times, for example, in the second surface region or between the at least one first surface region and the at least one second surface region of the carrier. In this way, the carrier can be split into two, three or more parts or segments. For example, precisely one first surface region and precisely one second surface region of the carrier can be provided. In this case, the carrier is typically broken down into exactly two parts or segments and the layer is then typically detached from that segment which forms the second surface region (or a part of the second surface region). However, it is also possible, for example, to provide two first surface regions and a second surface region lying between them. In this case, the carrier is severed by the described severing, for example, within the second surface region or respectively between the second surface region and the two first surface regions, so that the carrier is split into three segments, for example, into a middle segment and two outer segments. For example, the two first surface regions are each formed by one of the two outer segments and the second surface region by the middle segment. The layer (that is, its second region) is then completely detached, for example, from the middle segment (and possibly also partly from the two outer segments). The middle segment is then typically removed from the carrier arrangement. The layer (that is, its first two regions) remains on the first two surface regions of the two outer segments of the carrier. The detached second region then forms a flexible connection between the two remaining outer segments of the carrier.

The above-described severing of the carrier can take place, for example, along two or more cutting planes. The cutting planes can each run perpendicular to the above-mentioned main plane of the carrier or they can enclose an angle other than 90°. The angle can, for example, be in a range between 45° and 135°, for example, around 90°.

For example, the second region of the layer can be detached from the second surface region of the carrier in that a region of the carrier which forms the first surface region of the carrier (for example, the above-described middle segment of the carrier) is removed by etching. Corresponding embodiments for etching processes are described in detail below.

For example, before the second region of the layer is detached from the second surface region of the carrier, the adhesion of the second region of the layer to the second surface region can be completely or partially destroyed or at least reduced. In this way, a complete detachment of the second region of the layer from the carrier can be achieved or the subsequent mechanical detachment (for example, by peeling off) can be simplified. For example, the second surface region of the carrier can be irradiated with electromagnetic radiation. For example, the irradiation can take place through the carrier. For this purpose, the carrier can be formed, for example, from a material that is transparent to the selected radiation (wavelength). Additionally or alternatively, the second region of the layer adhering to the second surface region can also be irradiated with electromagnetic radiation.

In order to facilitate detachment, it is additionally or alternatively also possible to produce an intermediate layer which reduces the adhesive force, for example, on the second surface region of the carrier, before producing the layer on the surface of the carrier. In this case, at least the first surface region of the carrier is preferably left out. Alternatively, it is also possible for the intermediate layer which reduces the adhesive force to be removed again from the first surface region of the carrier before the layer is produced on the surface of the Alternatively or additionally, it is also possible to apply an intermediate layer which reduces the adhesive force on a partial layer of the layer and then to produce one or more further of the mentioned partial layers of the layer on this intermediate layer which reduces the adhesive force. These further partial layers can further be detached (for example, peeled off) from the intermediate layer (integrated or embedded in the layer in this way) and thus also from the carrier, without separating this detached (second) region of the layer from the remainder of the layer (the first region of the layer).

Additionally or alternatively, it is possible for an intermediate layer which reinforces the adhesive force to be applied to the first surface region of the carrier before the layer is produced on the surface of the carrier. When the intermediate layer which reinforces the adhesive force is applied, the second surface region can be left out. Alternatively, it is also possible for the intermediate layer which reinforces the adhesive force to be removed again from the second surface region of the carrier before the layer is produced on the surface of the carrier.

The intermediate layer, which reduces or reinforces the adhesive force, can, as will be described in more detail below, be produced and/or structured, for example, using thin film techniques and/or lithographic processes. Typically, the respective intermediate layer which reinforces or reduces the adhesive force is a monolayer, that is, a layer made of only one layer of the atoms or the molecules of the material of the intermediate layer which reinforces or reduces the adhesive force.

For example, at least one contact element, for example, an electrical, optical and/or microfluidic contact element, can be or is arranged on the carrier, for example, on the surface of the carrier, for example, within the first surface region. For example, starting from the first surface region of the carrier, the contact element can partially or completely pass through the carrier in its thickness and/or the first region of the layer in its thickness. For example, at least one (electrical, optical and/or microfluidic) connection is established between the at least one (electrical, optical and/or microfluidic) contact element and a (electrical, optical and/or microfluidic) line of the layer (for example, one of the lines mentioned above). It is also possible for the contact element to be electrically, optically and/or microfluidically connected to an electrical, optical and/or microfluidic line arranged on the carrier and/or to an electric, optical and/or microfluidic component arranged on the carrier.

Possible examples of components include integrated circuits, microchips, such as CMOS chips, CPUs or data storage devices, and energy storage devices, MEMS, MOEMS, resistors, antennas, coils, capacitors, sensors and actuators. For example, vias, plated-through holes such as TSVs, contact strips, solder contacts, external contacts for plug connections, plug strips, wire bond pads, contact pads, for example, for thermocompression connections can be considered as contact elements.

As already mentioned above, all features and embodiments specified for the carrier, for example, also apply accordingly to further carriers of the carrier arrangement, if any. For example, it is possible for at least one (further) electrical, optical and/or microfluidic contact element to be arranged on the surface of the further carrier. For example, at least one electrical, optical and/or microfluidic connection can be established between the (further) at least one electrical, optical and/or microfluidic contact element and a line of the layer. The contact element can, for example, also be conductively connected to an electrical, optical and/or microfluidic line arranged on the further carrier and/or to an electrical, optical and/or microfluidic component arranged on the further carrier.

For example, the layer itself can also be or is equipped with at least one (electrical, optical and/or microfluidic) component and/or one (electrical, optical and/or microfluidic) contact element. For example, the at least one component and/or the contact element can be arranged on the layer or integrated into the layer, for example, in the first region of the layer or in the second region of the layer. However, both regions of the layer can also be equipped with components. For example, the examples of components and contact elements mentioned above or below can be considered as components and contact elements.

If present, the at least one component and/or the at least one contact element is connected to at least one of the lines described above on or in the layer.

Preferably, the carrier arrangement proposed here or that produced using the method proposed here does not have a layer formed from an adhesive between the surface of the carrier and the first region of the layer. Preferably, the carrier arrangement, between the surface of the carrier and the first region of the layer, has at least no layer formed from an adhesive which is thicker than a monolayer of the material of the adhesive. (A monolayer is a layer consisting of only one layer of atoms or molecules of the respective material of the layer.) It is often possible to improve the temperature resistance and the chemical stability of the carrier arrangement by dispensing with an adhesive layer.

For example, the second region of the layer can protrude laterally beyond a (lateral) edge of the carrier and here, for example, stick out laterally from the carrier. This part protruding laterally beyond the carrier can, for example, be self-supporting or be connected to a further carrier (for example, as described above). So-called fan-out structures can be achieved in this way, for example. It is also possible for the second region of the layer to not protrude laterally beyond a (lateral) edge of the carrier, but rather to be arranged above the surface of the carrier, whereby a so-called fan-in structure can be formed, for example.

The invention is explained in more detail below with reference to specific embodiments, which are shown schematically in the following figures. They show.

In the figures and the following description, features that correspond to one another are denoted by the same reference symbols or with reference symbols that differ from one another by integer multiples of 100 (see the list of reference symbols at the end of the description).

Individual steps of an embodiment of the production method proposed here are shown in FIGS. 1A, 1B, 2A, 2B, 3A, 3B, 4A and 4B, in which an embodiment of a carrier arrangement 100 is produced as proposed here.

Figure 1A:
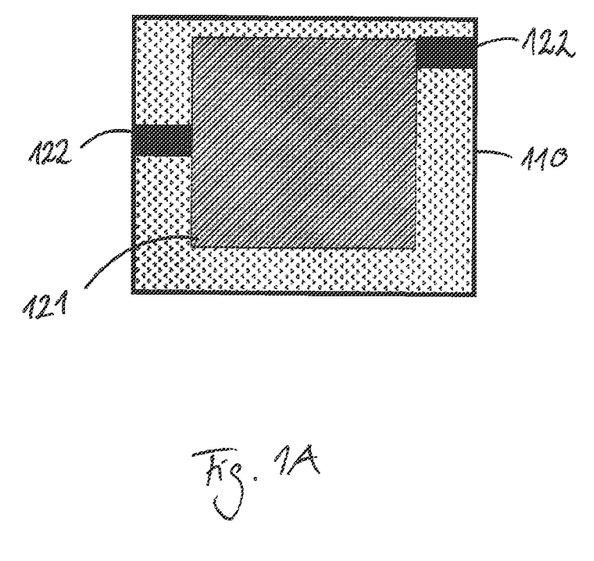
FIG. 1A a carrier for a carrier arrangement of the type proposed here in a view from above, FIG. 1B the carrier shown in FIG. 1A in a side view, FIG. 2A the carrier shown in FIG. 1A with a partial layer of a layer in a view from above, FIG. 2B the carrier shown in FIG. 2A with an applied partial layer in a side view, FIG. 3A the carrier shown in FIG. 2A with a further partial layer of the layer in a view from above, FIG. 3B the carrier shown in FIG. 3A with further partial layer in a side view, FIG. 4A a carrier arrangement of the type proposed here, with the carrier shown in FIG. 3A in a view from above, after regions of the carrier have been removed and components are arranged on regions of the layer detached from the carrier, FIG. 4B the carrier arrangement shown in FIG. 4A in a side view, FIG. 5A a further embodiment of a carrier arrangement of the type proposed here in a view from above, FIG. 5B the embodiment shown in FIG. 5A in a side view, FIG. 6A a further embodiment of a carrier arrangement of the type proposed here in a view from above, FIG. 6B the embodiment shown in FIG. 6A in a side view, FIG. 7A an example of a carrier for a carrier arrangement of the type proposed here in a view from above, FIG. 7B the carrier shown in FIG. 7A with an applied layer in a view from above with cutting planes drawn in, FIG. 7C a carrier arrangement of the type proposed here in a side view, produced from the carrier shown in FIG. 7B, FIG. 7D a variant of the embodiment shown in FIG. 7C, FIG. 8 an embodiment of a carrier arrangement of the type proposed here in a side view, FIG. 9 an example of a carrier for a carrier arrangement of the type proposed here in a view from above, FIG. 10A an embodiment of a carrier arrangement of the type proposed here in a view from above, and FIG. 10B an enlarged section of the illustration shown in FIG. 10A.
Figure 1B:
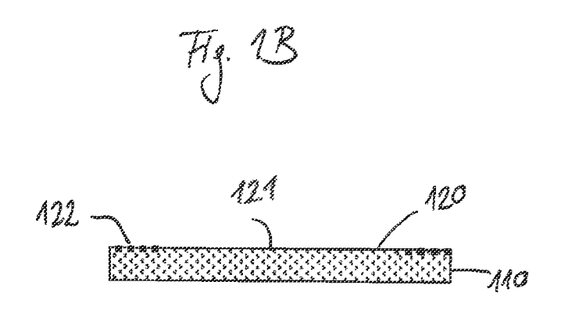

A carrier 110 having a flat surface 120 is shown in FIGS. 1A and 1B. The carrier 110 is made of silicon, for example, but could also be made entirely or at least partially from another material, such as glass, metal, ceramic or a polymer, or from a combination of two or more of these materials. For example, the carrier 110 is a wafer or part of a wafer. However, the carrier could also be a plate, such as a glass panel, or a band. The carrier 110 can, for example, be round or rectangular or have any other shape.

The carrier 110 is relatively rigid and thus only flexible to a relatively small extent. For example, a total thickness is in a range between 300 μm and 2000 μm. For example, the carrier has a total thickness of approximately 800 μm. Bending radii that can be achieved by bending the carrier 110 are, for example, above 250 mm.

In principle, however, it would also be possible for the carrier 110 to be designed flexible and pliable. In order to achieve this, the carrier 110 can be designed correspondingly thin, for example, having a total thickness in a range between 10 μm and 300 μm, for example, less than 200 μm.

In addition, FIGS. 1A and 1B show a first surface region 121 of the carrier 110 and two second surface regions 122 of the carrier 110, each of which adjoins the first surface region 121.

Various measures are possible in order to make it easier to detach the layer 130 still to be applied to the carrier 120, which detachment is still to be carried out later (see FIGS. 2A, 2B, 3A and 3B and the associated description below).

For example, an adhesive force-reducing intermediate layer (not shown) can be applied to the second surface region 122 on the surface 120 of the carrier 110 before the layer is produced. In this case, the remaining surface 120, particularly the first surface region 121 of the carrier, is preferably left out. Alternatively, it is also possible for the intermediate layer which reduces the adhesive force to be removed again at least from the first surface region 121 of the carrier 120 before the layer is produced on the surface 120 of the carrier 110.

Additionally or alternatively, it is possible for an intermediate layer which reinforces the adhesive force (not shown here) to be applied to the first surface region 121 of the carrier 110 before the production of the layer 130 on the surface 120 of the carrier 110. When the intermediate layer which reinforces the adhesive force is applied, the second surface region 122 can correspondingly be left out. Alternatively, it is also possible for the intermediate layer which reinforces the adhesive force to be removed again from the second surface region 122 of the carrier 110 before the layer is produced on the surface of the The respective intermediate layer which reinforces or reduces the adhesive force can be applied to the surface 120 of the carrier 110 and structured, for example, by means of thin film techniques and/or lithographic methods. For example, the intermediate layer can (as required) be removed again from the first surface region 121 or from the second surface region by means of ($O_2$) plasma etching.

Typically, the respective intermediate layer which reinforces or reduces the adhesive force is a monolayer, that is, a layer made of only one layer of the atoms or the molecules of the material of the intermediate layer which reinforces or reduces the adhesive force.

The material of the intermediate layer which reduces the adhesive force is typically selected such that the layer 130 still to be applied adheres to the intermediate layer which reduces the adhesive force (in the second surface region 122 of the carrier 110) with a lower adhesive force than to the material of the carrier 110. Accordingly, the material of the intermediate layer that reinforces the adhesive force is typically selected such that the layer 130 still to be applied adheres to the intermediate layer that reinforces the adhesive force (in the first surface region 121 of the carrier 110) with a greater adhesive force than to the material of the carrier 110. Depending on the material of the carrier 110 and the material of the layer 130, it is possible, for example, to influence how hydrophilic or how hydrophobic the first and second surface regions of the carrier are by the intermediate layer which reduces or reinforces the adhesive force.

In the present example, the layer 130 still to be applied can, for example, be formed from a polymer entirely or at least in some regions, for example, in regions that are directly adjacent to the material of the carrier 110 or to the intermediate layer that reinforces the adhesive force or the intermediate layer which reduces the adhesive force. For example, the polymer can include a polyimide (PI) or a polybenzoxazole (PBO), or a combination thereof.

Functional groups of the polymer can be integrated in the polymer of the layer 130, for example, as adhesion promoters, for example, so-called "build-in adhesion promoters". These can, for example, have the property of entering into covalent bonds with the carrier material (here, for example, silicon or glass). In order to reduce the adhesive force, for example, the surface 120 of the carrier 110 can be changed, for example, such that the covalent bonds are suppressed or are no longer stable, for example, by means of the above-mentioned intermediate layer which reduces the adhesive force.

Examples of suitable polymers (or polymer systems) having integrated adhesion promoters for the layer 130, particularly for its partial layers 133, 134, are, for example, polyimides (PI) and polybenzoxazoles (PBO) or combinations thereof. The polyimides include, for example, the following commercial products: the LTC9300 series and the DUR7300 series from the manufacturer Fujifilm; the HD4100 series from HD MicroSystems; the Pimel BL-300 series and the BM-300 series from the manufacturer Asahi Kasei. The polybenzoxazoles (PBO) include, for example, the following commercial products: the HD-8820 series and the HD89xx series from the manufacturer HD Microsystems.

The adhesive force-reducing intermediate layer can contain, for example, organosilane compounds (for example, hexamethyldisilazane (HMDS), diphenylsilanediol). These can, for example, form Si—O compounds with the native oxide of the carrier. For example, hydrophobic surfaces having —CH3 or —C6H5 monolayer groups are formed on the surface 120 of the carrier 110.

Alternatively, it is also possible that the above-mentioned polymer of layer 130 adheres only relatively weakly to the respective carrier material (for example, silicon or glass), for example, because it does not contain a build-in adhesion promoter. In this case, it is possible to apply a corresponding "adhesion promoter" to the surface of the carrier as an intermediate layer that reinforces the adhesive force. Organosilane compounds, for example, are an example of a suitable material for an intermediate layer which reinforces the adhesive force. These are particularly suitable for reinforcing the adhesion of polymers, such as polyimides, to carrier materials (such as silicon or glass). Examples of such polymers are, for example, polyimides from the PI-2600, PI-2525, PI-2555 series from the manufacturer HD Microsystems. Organosilane compounds, such as, for example, the products VM-651 and VM-652 from the manufacturer HD Microsystems, can be considered as a material for the intermediate layer which reinforces the adhesive force.

The intermediate layer which reinforces the adhesive force can contain, for example, organosilane compounds which, for example, form Si—O compounds with the (native) oxide of the carrier, such as, for example, aminopropyltriethoxysilane. The amino group can function as a functional group for polyimide polymers in layer 130, for example. The Si—OCH$_3$ forms, for example, Si—O compounds with native oxide of the carrier 130.

In contrast to a conventional adhesive, the intermediate layer which reinforces the adhesive force preferably forms covalent bonds with the respective polymer of the layer. As already described above, the intermediate layer which reinforces the adhesive force is preferably present in the form of a monolayer and is thus considerably thinner than conventional adhesive layers.

Preferably no further layer is located between the layer 130 and the first surface region 121 of the carrier 110, at least no further layer having a layer thickness greater than a monolayer of the material forming this layer. Preferably, no layer of an adhesive which is thicker than a corresponding monolayer of the adhesive is arranged between the layer 130 and the first surface region 121 of the carrier 110.

As an alternative to the intermediate layer which reduces the adhesive force described above, it is also possible to reduce the adhesion of the second region 132 of the layer 130 to the second surface region 122 by irradiating with electromagnetic radiation the second surface region 122 of the carrier and/or the second region 132 of the layer 130 adhering to the second surface region 122 through the carrier 110. The electromagnetic radiation can be, for example, laser radiation, such as, for example, laser radiation from a UV light excimer laser, for example, with λ=248 nm or 308 nm, or laser radiation from a MidIR laser. Typically, the adhesion interface between polymer and substrate is completely or at least partially destroyed by absorption of the electromagnetic radiation and photochemical decomposition. For example, atomic and/or molecular bonds in the transition between the carrier and the layer 130 can be destroyed, for example, by means of laser ablation. In addition, the irradiation between the carrier and the layer can result in gaseous (by)products which, for example, open the bonding interface between the carrier 110 and the layer 130. An auxiliary layer can optionally be applied between layer 130 and carrier 110, which auxiliary layer can contain chromophores, for example, and acts as an absorber layer for the radiation. For example, the product Brewer Bond 701 from the manufacturer Brewer Science can be used for this.

As shown in the following FIGS. 2A, 2B, 3A and 3B, the already mentioned layer 130 is produced on the surface 120 of the carrier 110, more precisely on the first surface region 121 and the two second surface regions 122. The layer 130 comprises a first region 131 which covers the first surface region 121. In the example shown, the layer 130 also comprises two second regions 132, which are each connected to the first region 131 of the layer 130. Each of the two second regions 132 covers exactly one of the two second surface regions 122 of the carrier 110. In this example, the layer 130 is multilayered and comprises a first partial layer 133 and a second partial layer 134, which are arranged one above the other within the first surface region 121 of the carrier 110.

Figure 2A:
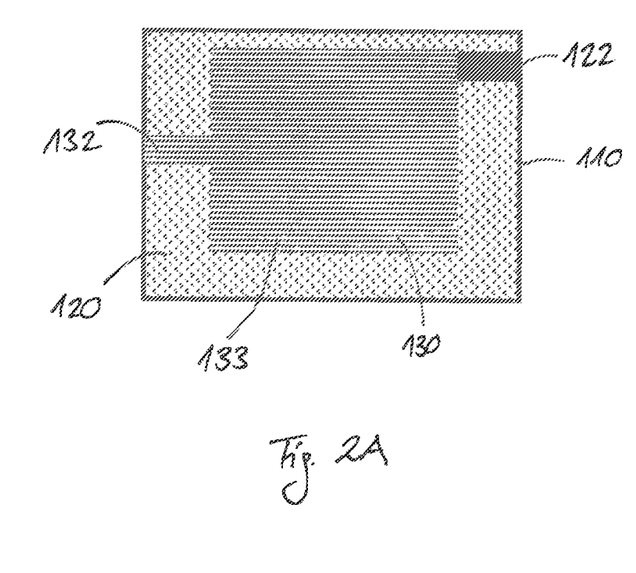
Figure 2B:
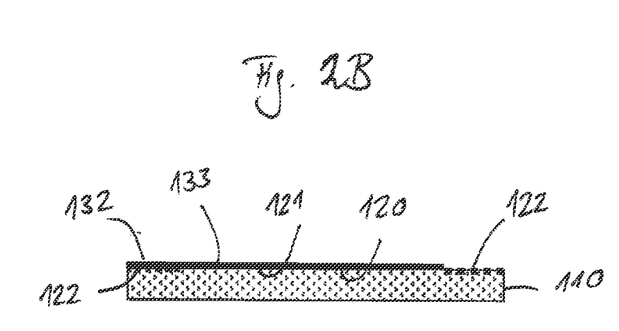

The carrier 110 shown in FIGS. 1A and 1B is shown in FIGS. 2A and 2B in a view from above and in a side view, respectively, after the first partial layer 133 has been produced on the first surface region 121 of the carrier 110 and on one of the two second surface regions 122 of the carrier 110. The other of the two second surface regions 122 was left out here.

Figure 3A:
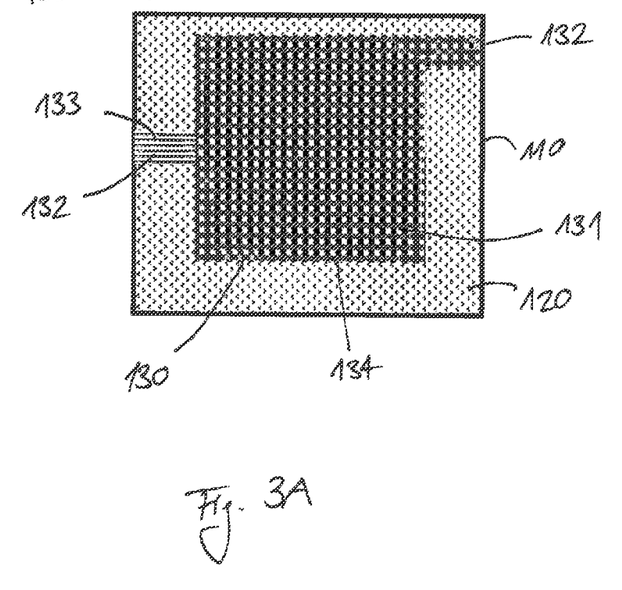
Figure 3B:
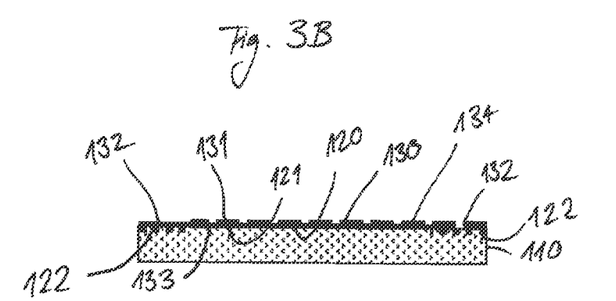

The carrier 110 shown in FIGS. 2A and 2B is shown in FIGS. 3A and 3B in a view from above and in a side view, respectively, after the second partial layer 134 has been produced on the first surface region 121 of the carrier 110 (there on the first partial layer 134) and on that of the two second surface regions 122 of the carrier 110 on which the first partial layer 133 has not been produced. That of the two second surface regions 122 to which the first partial layer 133 has been applied has now been left out.

The layer 130 is therefore produced in the first surface region, for example, directly on the material of the carrier 110 and in the second surface regions 122 on the material of the intermediate layer which reduces the adhesive force. Alternatively, it is possible for the layer 130 in the first surface region to be produced, for example, on the material of an intermediate layer which reinforces the adhesive force, and to be produced directly on the material of the carrier 110 in the two second surface regions 122.

The layer 130 can be formed entirely or at least in some regions from a polymer, for example, from polyimide or polybenzoxazole, from a metal, from glass, ceramic or from silicon or from a combination of two or more of these materials. In order to achieve said flexibility or pliability of the layer, it can be provided that the layer has a sufficiently small overall thickness. In this way, relatively rigid or brittle materials can also be used to form the flexible layer.

The layer 130 can also comprise further layers in addition to the partial layers 133, 134 shown. The partial layers 133, 134 or the further partial layers can differ from one another in terms of their materials and functions. The partial layers 133, 134 can be, for example, electrical insulating layers formed from an electrically insulating material, such as the above-mentioned polymers, or further intermediate layers which reduce the adhesive force, for example, to enable partial detachment of the partial layers 133, 134 from one another.

Conductive layers, which contain electrically conductive materials, for example, can be formed on or between the insulating layers. For example, metals such as copper (Cu), aluminum (Al), titanium (Ti) and gold (Au) are used as electrically conductive materials. These conductive layers can also be produced and structured using the thin film techniques and lithographic processes described, as will be described in more detail below.

Figure 9:
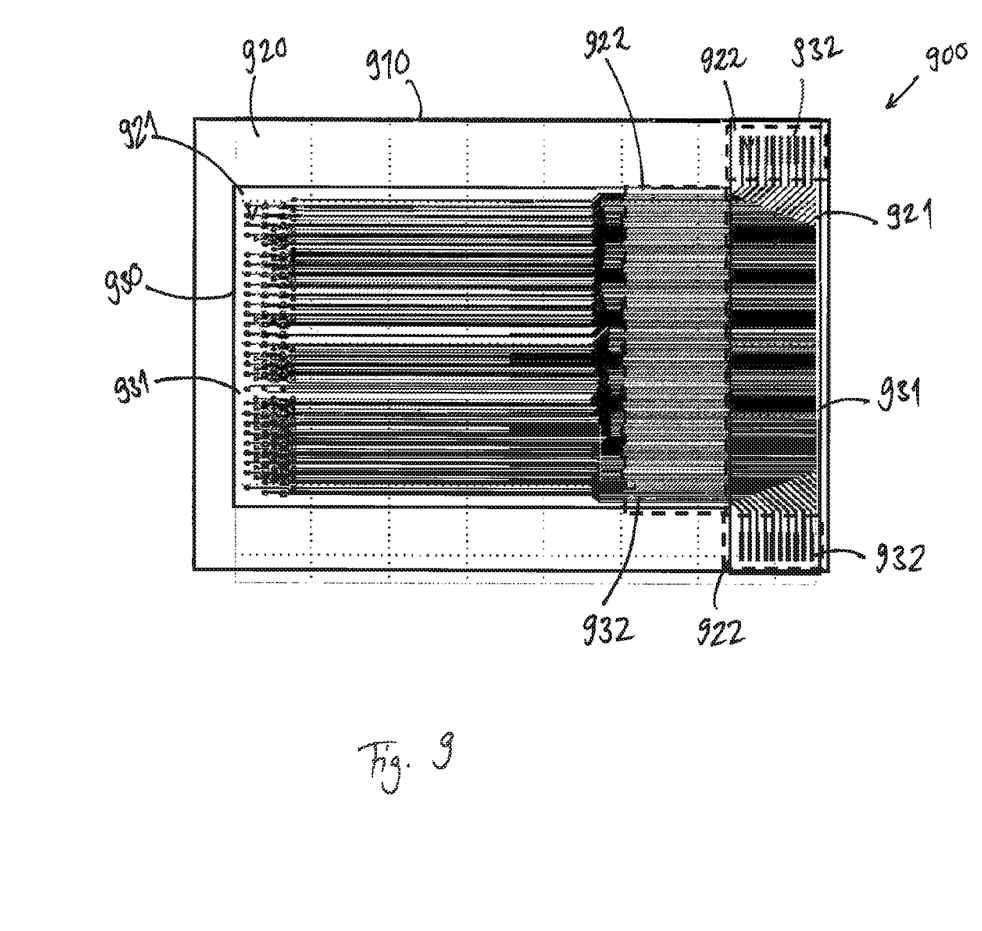
Figure 10A:
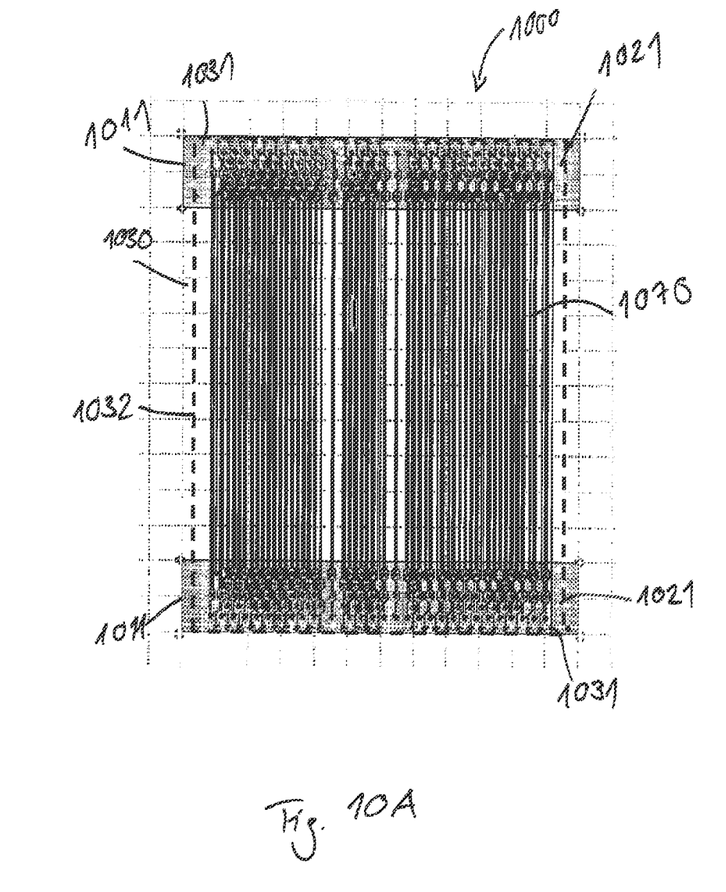
Figure 10B:
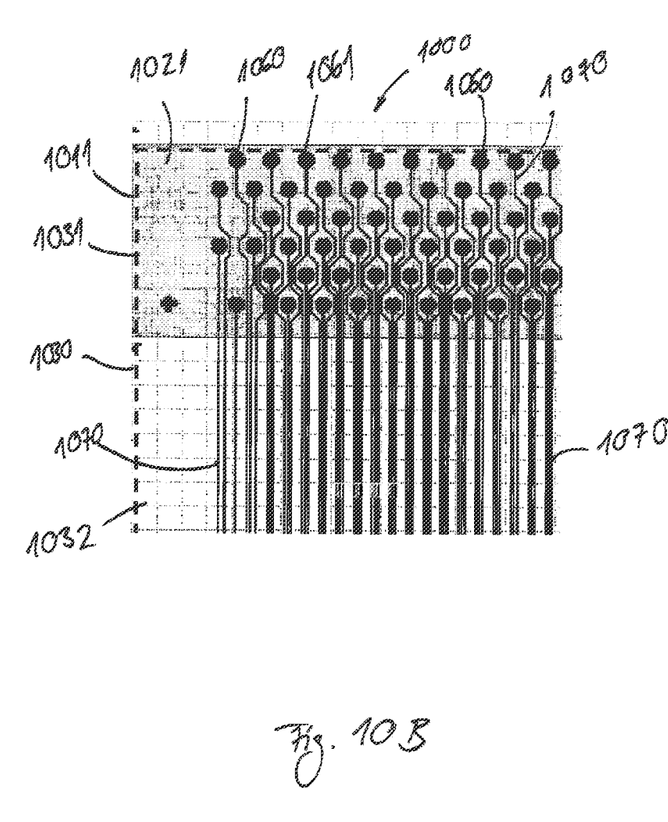

For example, the line layer comprises at least one line (not shown here), for example, an electrical conductor track, which, starting from the first region 131 of the layer 130, extends into one of the two second regions 132 of the layer 130. Examples of conductive layers having conductor tracks are shown in FIGS. 9, 10A and 10B.

The insulating layers each have, for example, a layer thickness in a range between 1 µm and 300 µm, for example, 10 µm. The conductive layers each have, for example, a layer thickness in a range from 0.25 µm to 100 µm, for example, 5 µm. The conductor track widths and distances between the conductor tracks can be, for example, 0.5 µm or more, for example, 1 to 30 µm or up to 250 µm.

Alternatively or additionally, further partial layers of the layer 130 can be considered, such as the above-mentioned electrical, optical and/or microfluidic insulating layers and electrical, optical and/or microfluidic conductive layers and, possibly, intermediate layers which reduce adhesive force, in order to enable or facilitate the detachment of regions of partial layers of the layer arranged above it.

For example, known thin film techniques such as PVD, CVD, photolithography and laser ablation can be used to produce the layer 130, that is, particularly the partial layers 131, 132, and possibly further partial layers, such as insulating layers, conductive layers and layers which reduce the adhesive force. For example, the line layers can be produced by depositing a line layer by means of PVD or CVD and subsequent lithographic masking and galvanic deposition or direct etching (subtractive structuring). Chemical direct metallization processes for applying the conductive layer are also possible. PVD and subsequent galvanic reinforcement are preferred. Insulating layers, such as polymer layers, can be applied, for example, by means of spin coating and then structured, preferably photolithographically or by laser ablation. For example, a thermal treatment or polymerization of the polymer layer can be performed.

The structure of the layer 130 described above is only one possible embodiment among many. In alternative embodiments, the layer 130 can also be a metal foil or a functional polymer foil, for example, for optical applications or for filters.

Figure 4A:
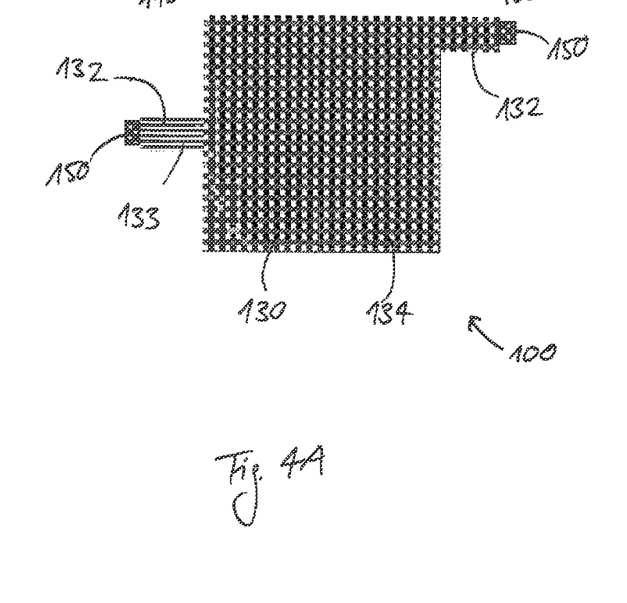
Figure 4B:
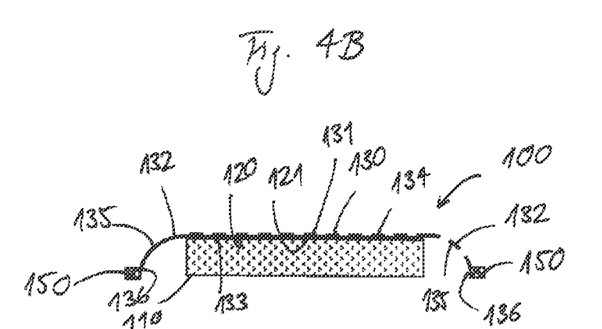

As shown in FIG. 4A and particularly clearly in FIG. 4B, the two second regions 132 of the layer 130 have been detached from the two second surface regions 122 of the carrier 110. Those regions of the carrier 110 which previously formed the two second surface regions 122 (and in this example also all further regions of the carrier 110 which did not form the first surface region 121 or the second surface region 122 of the carrier 110) have been removed. The two detached second regions 132 of the layer 130 thus protrude laterally beyond the current edge of the carrier 110. For example, they have been bent downward (that is, toward the carrier 110), but could just as easily be bent upward away from the carrier. Each of the two second regions 132 thus has a curved region 135 and a flat region 136. The bending radius of the curved region 135 corresponds, for example, to five times the total thickness of the respective second region 132 of the layer 130, but could, for example, also be substantially smaller and, depending on the flexibility, correspond to the total thickness of the second region 132 of the layer 130 or less, for example.

Particularly, the second regions 132 are thus bent out of the plane defined by the first surface region 121 of the carrier 110, so that the respective flat regions 136 (or the planes defined thereby) each enclose the above-mentioned angle with the plane formed by the first surface region 121 of the carrier. Due to the flexibility of the layer in the detached second regions 132, the angle can be selected practically as desired. For example, the angle is in a range between 45° and 135°, for example, around 90°. In principle, bends about any axes are possible, that is, particularly also twists (torsions) of the detached second regions 131.

For example, the two second regions 132 of the layer 130 may have been detached from the carrier 110 in that, for example, those regions of the carrier 110 which form the second surface regions 122 of the carrier 110 (and in this example also all further regions of the carrier 110 that do not form the first surface region 121 or the second surface region 122 of the carrier 110) have been removed by etching. For this purpose, for example, a correspondingly structured etching mask may have been produced on the rear side of the carrier 110 (facing away from the layer 130), for example, by means of known lithographic processes. The etching can take place, for example, by means of known DRIE processes or wet-chemically. Silicon, for example, can be considered as a material particularly suitable for the carrier 110 for etching processes. For example, the carrier 110 can be fastened to a temporary carrier for performing the etching process, for example, on a dicing tape, a film frame or an alternative substrate.

However, it is also possible that the two second regions 132 of the layer 130 have been mechanically separated from the two second surface regions 121, for example, by peeling them off, particularly in the case that an intermediate layer which reduces the adhesive force is arranged on each of the two second surface regions 121, as described above.

Finally, it is also possible for the two second regions 132 of the layer 130 to be detached from the two second surface regions 121 of the carrier 110 by means of electromagnetic radiation, for example, by means of UV light excimer laser with a wavelength of, for example, 248 nm or 308 nm or with laser radiation of an MidlR laser as described above. The material of the carrier 110 is preferably transparent to the electromagnetic radiation so that the irradiation can take place through the material of the carrier, for example, starting from an underside of the carrier facing away from the layer 130. For example, the carrier 110 can be formed from a glass that is transparent to the radiation.

For example, after the mechanical and/or detachment by means laser irradiation of the two second regions 132 of the layer 130, those regions of the carrier 110 which do not form the first surface region 121 can also be removed. This can be done, for example, by separating these regions of the carrier 110 before or after the step of detaching the first regions 131 of the layer 130 from the rest of the carrier 110, for example, by means of a saw or a laser. For example, the carrier 110 can be severed along cutting planes which run, for example, between the first surface region 121 and one of the two second surface regions 122 in each case. However, when the carrier 110 is severed, the layer 130 is not severed.

In addition, at least one contact element (not shown here), a mechanical connection element (not shown here) and/or a component 150 is arranged on each of the two second regions 132 of the layer 130. The contact element and/or component is connected, for example, to at least one electrical conductor of the conductive layer(s) of the layer 130. Further components and contact elements (not shown) can, for example, be arranged on the layer 130 or integrated in the layer 130, for example, in the detached second regions 132 or in the first region of the layer 130.

Examples of the components 150 mentioned include CMOS chips, memories, CPUs, MEMS, MOEMS, passive elements such as resistors, antennas, coils, capacitors and also sensors and actuators. Further examples of the components have been given above. The contact elements and mechanical connection elements can be, for example, contact strips, plug connection elements, plug strips, external contacts for plug connections, solder contacts, wire bond pads, contact pads, for example, for thermocompression connections, micro-contact elements or micro-solder bumps or bonding wires.

Figures 5A, 5B:
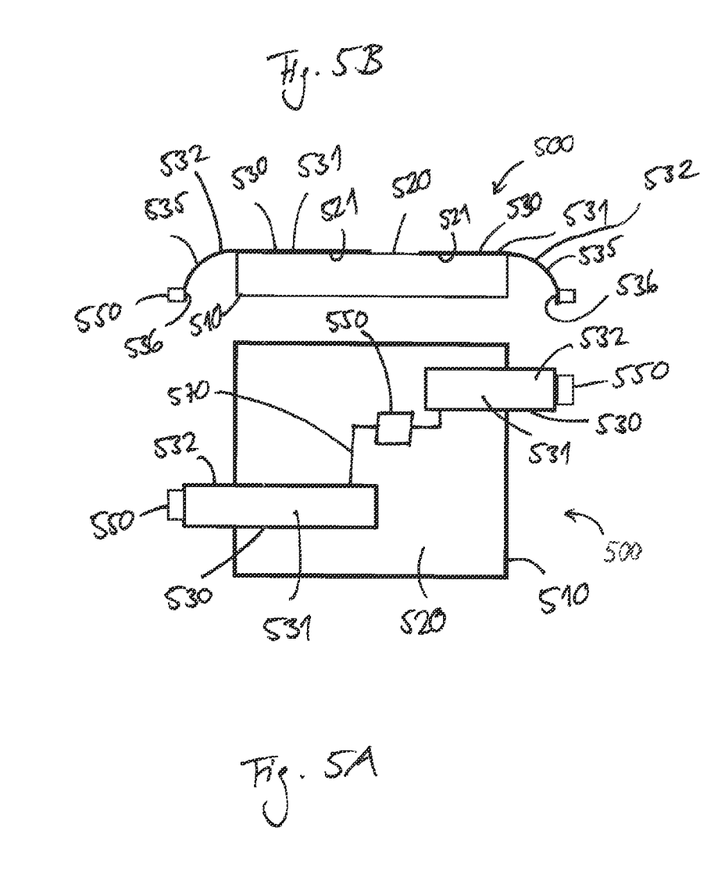

FIGS. 5A and 5B show a further embodiment of a carrier arrangement 500 proposed here, which can, for example, have been produced using the same production method as the carrier arrangement 100 shown in FIGS. 4A and 4B and differs therefrom, for example, only in its geometric configuration. (The reference numbers of corresponding features are therefore increased by 400 compared to the embodiment shown in FIGS. 4A and 4B.) The following therefore primarily describes the differences from the carrier arrangement shown in FIGS. 4A and 4B.

The carrier arrangement 500 thus has a carrier 510, the structure of which may, for example, correspond to the carrier 110 shown in FIGS. 4A and 4B, but on the surface 520 of which, as shown in FIGS. 4A and 4B, not only a continuous layer 130 is arranged, but rather, for example, two layers 530 that are spatially separated from one another are arranged. The layers 530 can, for example, correspond in their production and their structure to the layer 130 of the carrier arrangement 100 shown in FIGS. 4A and 4B. The layers 530 thus each have a first region 531, which layers are each arranged on one of two first surface regions 521 of the carrier 510 that are spatially separated from one another. Each of the layers 530 also has a flexible second region 532 which is connected to the first region 531 of the respective layer 530 and is not arranged on the surface 520 of the carrier 510, but rather, for example, protrudes laterally beyond an edge of the carrier 510 and is bent downward in the direction of the carrier 510.

In addition to the component 550 on the two second regions 532 of the layer 530, a possible further component 550 of the carrier arrangement 500 is also shown in FIG. 5A, which component is arranged on the surface 520 of the carrier 510 and is connected via conductor tracks 570 to conductor tracks (not shown) integrated in the layers 530 and to the components 550 arranged on the second regions 531 of the layers 530. For the components 550 shown in FIGS. 5A and 5B, for example, the same examples can be considered as specified above for the components 150 shown in FIGS. 4A and 4B.

Figures 6A, 6B:
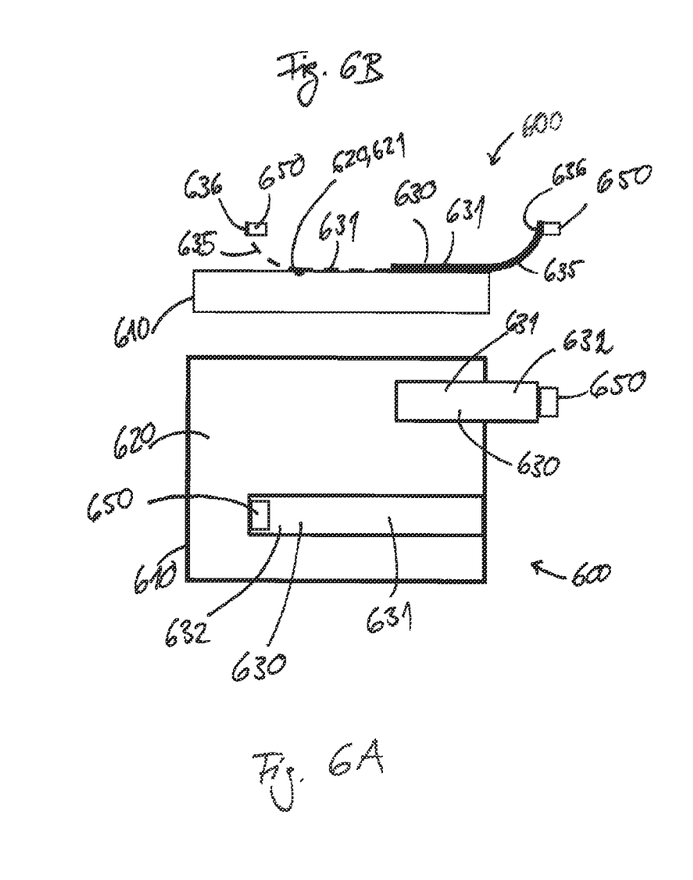

The embodiment of a carrier arrangement 600 shown in FIGS. 6A and 6B differs from the carrier arrangement 500 shown in FIGS. 5A and 5B substantially only in terms of its geometric configuration. (The reference numbers of corresponding features are therefore increased by 100 compared to the embodiment shown in FIGS. 5A and 5B.) As in the embodiment 500 shown in FIGS. 5A and 5B, the carrier arrangement 600 has two layers 630 arranged on a carrier 610, each having a first region 631, which is arranged in each case on one of two first surface areas 621 of the carrier 610 spatially separated from one another. Each of the layers 630 also has a flexible second region 632 which is connected to the first region 631 of the respective layer 630 and is not arranged on the surface 620 of the carrier 610. In one case, one of the two second regions 632 protrudes laterally beyond an edge of the carrier 610 and is bent upward away from the carrier 610. The other of the two second regions 632 does not protrude laterally beyond an edge of the carrier 610, but rather is arranged above the surface 620 of the carrier 610 and is bent upward away from the surface 620 of the carrier 610.

The two flexible detached regions 532 of the layer 530 thus form so-called fan-out structures in the example shown in FIGS. 5A and 5B, since they protrude laterally beyond the edge of the carrier 510 and are therefore no longer arranged over its base area. In contrast, in the example shown in FIGS. 6A and 6B, only one of the two detached regions 632 forms such a fan-out construction. The other detached region 632, which does not protrude laterally beyond the edge of the carrier 610 but rather is arranged above the surface 610, forms a so-called fan-in construction.

The production and configuration of a further embodiment of a carrier arrangement 700 of the type proposed here is described with reference to FIGS. 7A, 7B and 7C. The carrier arrangement 700 differs, for example, from the carrier arrangement 100 shown in FIGS. 4A and 4B substantially in its geometric configuration. Corresponding features of the carrier arrangement 700 are therefore provided with reference symbols which are increased by 600 compared to the carrier arrangement 100 shown in FIGS. 4A and 4B.

Figure 7A:
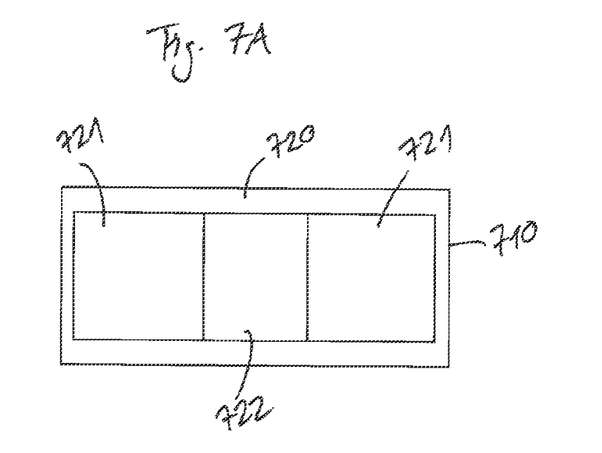

In FIG. 7A, a carrier 710 of the carrier arrangement 700 is shown, which can correspond, for example, to the carrier 110 shown in FIGS. 4A and 4B. A flat surface 720 of the carrier 710 has two first surface regions 721 spatially separated from one another and a second surface region 722 lying between them and each adjoining the two first surface regions 721. As shown in FIG. 7B, a continuous layer 730 has been produced on these surface regions 721, 722. This layer 730 can correspond, for example, to the layer 130 described above in terms of its production, composition and structure. The layer 730 comprises two first regions 731 which each cover one of the two first surface regions 721, and a second region 732 which is connected to the two first regions 731 and covers the second surface region 722.

Figure 7B:
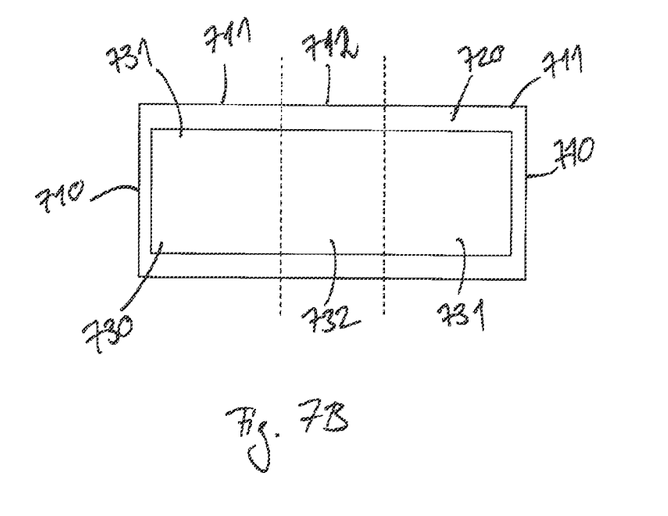

In addition, two cutting planes are shown as dashed lines in FIG. 7B. The carrier 710 is severed along these cutting planes by means of a saw or a laser, but without severing the layer 730. As a result, the carrier 710 is split into two lateral first carrier segments 711, which each form one of the two first surface regions 721, and into a middle, second carrier segment 712, which forms the second surface region 722.

In a subsequent step, the second region 732 of the layer 730 is detached from the second surface region 722 and thus separated from the middle, second carrier segment 712. The detachment can take place, for example, mechanically by peeling the second region 732 off the second surface region 722 and/or by means of laser irradiation, as described above. For this purpose, it would be possible, for example, as also described above, to apply an intermediate layer which reinforces the adhesive force to the two first surface regions 721 or to apply an intermediate layer which reduces the adhesive force to the second surface region 722 in order to facilitate the mechanical detachment, and/or to apply an absorber layer to the second surface region 722, which layer improves the absorption of the laser radiation.

Alternatively, it would also be possible to perform the detachment chemically, for example, by removing the middle second carrier segment 712 by etching, for example, using an etching mask, as also described above. In this case, it would in principle also be possible to dispense with severing the carrier by means of a saw or laser.

Figure 7C:
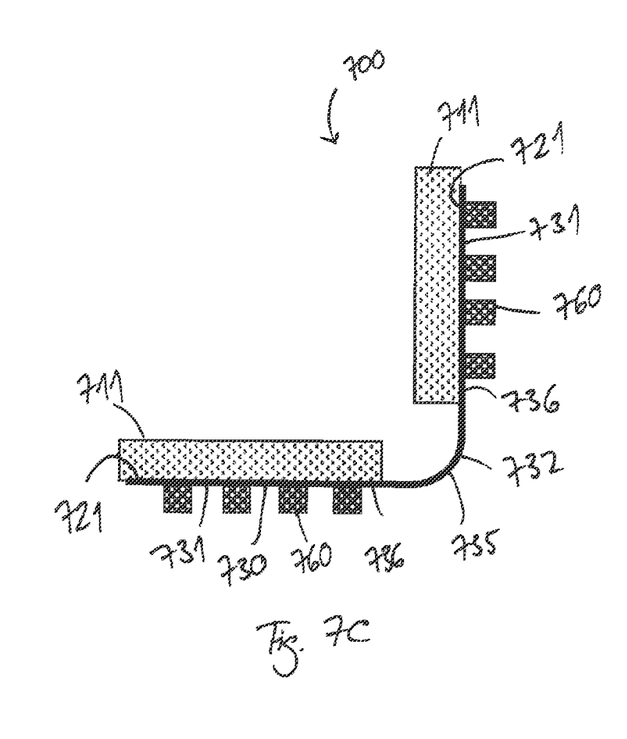

As shown in FIG. 7C, the detached second region 732 of the layer 730 is bent by approximately 90°, so that the two remaining first carrier segments 711 are approximately perpendicular to one another. Of course, other angles and a folding of the detached second region 732 would just as well be possible so that the two carrier segments are aligned parallel to one another, for example, wherein the two first surface regions 721 face one another or face away from one another, for example. In addition, twisting (torsion) of the detached second region 732 can also be implemented.

As is also shown in FIG. 7C, contact elements 760 are arranged on the two first regions 731 of the layer 730, which contact elements make electrical contact of electrical conductors integrated in the layer 730 possible.

Figure 7D:
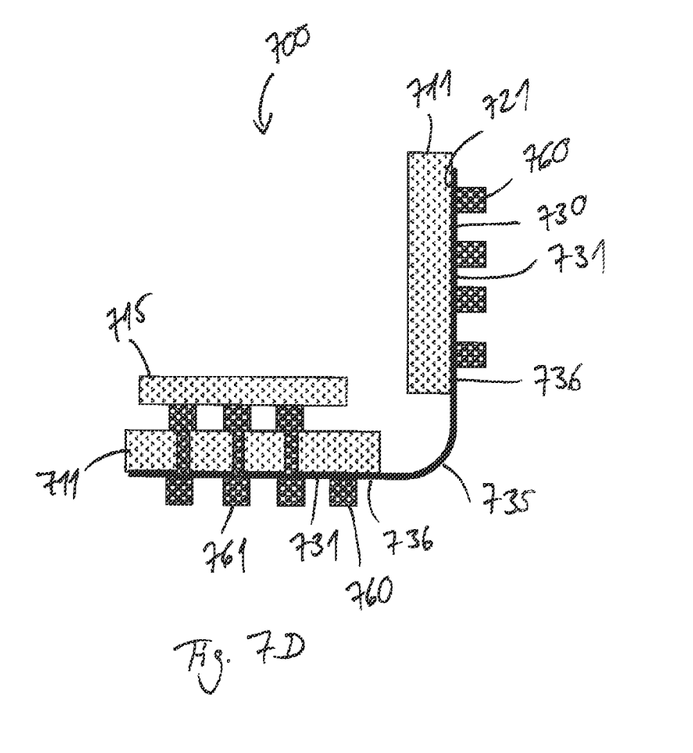

FIG. 7D shows a variant of the carrier arrangement 700 shown in FIG. 7C, in which one of the two carrier segments 711 is equipped with plated-through holes 761, which enable electrical conductors integrated in the layer 730 to be electrically contacted on both sides, that is, particularly from the upper side of the carrier segment 711, on which the layer 730 is arranged, and from an opposite rear side of the carrier segment 711. In the example shown, a further carrier (substrate) 715 of the carrier arrangement 700 is fastened on the rear side of the carrier segment 711 and is electrically connected to the lines integrated in the layer 130 via the plated-through holes 761.

In the embodiments shown in FIGS. 7C and 7D, the two carrier segments 711 are only connected by the flexible second region 732 of the layer 730. As a result, the mechanical and thermal coupling between the two carrier segments 711 is reduced, whereby particularly thermo-mechanical stresses can be reduced.

Figure 8:
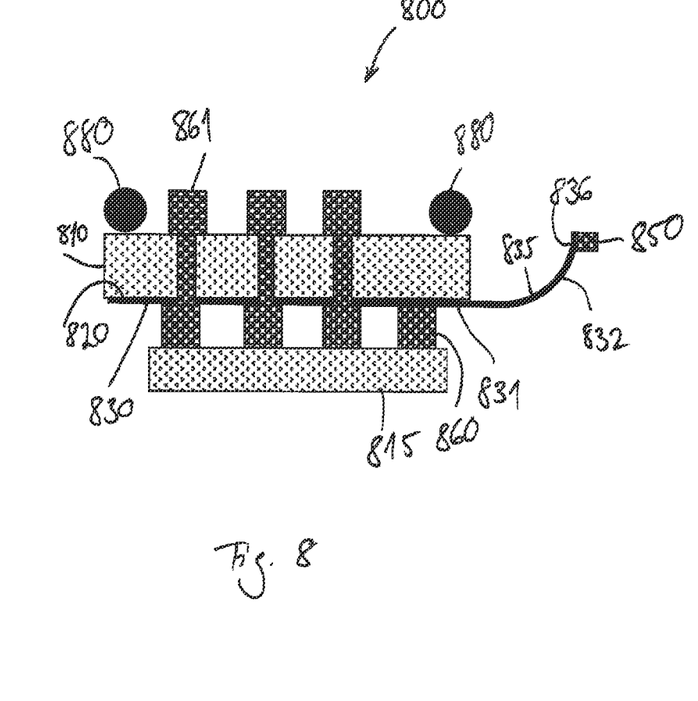

FIG. 8 shows a further embodiment of a carrier arrangement 800 of the type proposed here, which can be produced using the method described above. The carrier arrangement 800 thus comprises a carrier 810, which can be made of glass or silicon, for example, and on the surface 820 of which a first region 831 of a layer 830 is arranged. The layer 830 also has a second region 832, which is connected to the first region 831 and is not arranged on the surface 820, but rather protrudes laterally over an edge of the carrier 810 and is bent in the direction of the carrier. For example, the layer 830 may have been generated by means of the production method described in connection with the embodiment 100 shown in FIGS. 4A and 4B and can have corresponding features. Similar to the embodiment 700 shown in FIG. 7D, the carrier 800 also has contact elements 860 and plated-through holes 861, via each of which an electrical connection to one or more electrical conductors integrated in the layer 830 can be established. A further carrier 815 (substrate) of the carrier arrangement 800 is mechanically connected to the carrier 810 via the plated-through holes 761 on the upper side of the carrier 810 and is also electrically connected to the above-mentioned conductors of the layer 830. On the back side of the carrier 810, which is opposite to the above-mentioned upper side, further connection elements 880 are arranged in addition to the plated-through holes 861, which connection elements enable a mechanical and/or electrical connection of yet a further carrier (not shown here) to the carrier 810, preferably by means of a solder connection. The mechanical connection elements 880 are formed, for example, by so-called micro-contact elements or so-called micro-solder bumps, bonding wires or plug connection elements.

The carrier arrangement 800 shown in FIG. 8 can be used, for example, as a so-called interposer, in which it is fastened on a further carrier (not shown here), for example, with the mechanical connection elements 880 and plated-through holes 861. The component 850 on the detached second region 832 of the layer 830 can, for example, be a connector strip having electrical and/or optical contacts or be designed as any other interface. The detached second region 832 forms a so-called fan-out structure.

FIG. 9 shows an intermediate stage in the production of a further embodiment of a not yet completed carrier arrangement 900 of the type proposed here. A carrier 910 is shown, which can be made of glass or silicon, for example, and the surface 920 of which has, for example, two first surface regions 921 and three second surface regions 922 (each surrounded by dashed lines). For example, an intermediate layer which reduces the adhesive force has been produced on each of the three second surface regions 922, for example, as already described above in connection with the embodiment shown in FIGS. 4A and 4B. A continuous layer 930 has then been produced on the surface 920. The layer 930 has two first regions 931 which each cover one of the two first surface regions 921, and three second regions 932 which are connected to the two first regions 931 and which each cover one of the three second surface regions 922. For example, the layer 930 may have been generated by means of the production method described in connection with the embodiment 100 shown in FIGS. 4A and 4B and can have corresponding features. Particularly, electrical lines 970 are shown here, which are embedded in the layer 930, for example, and which run through the first and second regions 931, 932 of the layer and connect to one another. Similar to the embodiments 700, 800 shown in FIGS. 7D and 8, the carrier 910 also has contact elements 960 and plated-through holes 961, via each of which an electrical connection to one or more of the electrical lines 970 integrated in the layer 830 can be established.

In subsequent method steps (not shown here), the three second regions 932 of the layer 930 can be detached from the second surface regions 922, for example, using one of the methods described above, for example, by mechanical detachment. Before or afterwards, the carrier 910 can be split into first and second carrier segments, for example, by sawing through the carrier 910 along cutting planes. For example, these cutting planes can run between the first and second surface regions 921, 922. In this case, first and second carrier segments are preferably created, wherein each of the first carrier segments respectively forms one of the first surface regions 921 and each of the second carrier segments respectively forms one of the second surface regions 921. The second carrier segments are typically removed from the carrier arrangement 930, and thus do not form any part of the completed carrier arrangement 900. After detachment, the regions 932 are flexible and can, for example, be rotated or bent in order to enable a desired relative alignment of the carrier segments to one another.

FIGS. 10A and 10B schematically show a further embodiment of a carrier arrangement 1000 proposed here, wherein FIG. 10B shows an enlarged partial section of FIG. 10A. The carrier arrangement 1000 corresponds in its production and its structure, for example, to the embodiment 700 shown in FIGS. 7A, 7B and 7C and thus also comprises two rigid first carrier segments 1011 and a layer 1030, the edge of which is shown in FIGS. 10A and 10B by a dashed line. The layer 1030 comprises two first regions 1031, which cover the first surface regions 1021 formed by the first carrier segments 1011, and a second region 1032 which connects to the two first regions 1031 but is not arranged on the first carrier segments 1011, but rather runs between them and thus connects them to one another. Due to the flexibility of the layer 1030 in the second region 1032 detached from the original carrier 1010, the two first carrier segments 1011 can be moved relative to one another, for example, to perform compensating movements relative to one another.

The layer 1030 is configured in multiple layers and comprises, particularly, electrical insulating layers and electrical conductive layers, thus forming a wiring layer, for example. The line layers comprise electrical lines 1070, which each run through the two first regions 1031 and the second region 1032 of the layer 1030, thus allowing electrical signal transmission between the two first carrier segments 1011. In addition, electrical contact elements 1060 and plated-through holes 1061 are arranged on the two first carrier segments 1011, each of which enables electrical contact to be made with the lines 1070. The contact elements 1060 and/or the plated-through holes 1061 can, for example, have already been produced before the production of the layer 1030 on the first surface regions 1021 or only afterwards.

The embodiments shown here are, for example, also microsystems or parts of microsystems, for example, for microelectronic, micromechanical, microfluidic and/or electro-optical applications. As already mentioned, the carrier arrangements shown can be connected to further components (see the above-mentioned examples of components), particularly via the contact elements and plated-through holes shown. In addition, further components and further carriers can be arranged on the carriers, carrier segments and further carriers shown, and on or within the layers shown, in order to expand the functionality of the respective microsystem and/or to create further contact planes and interfaces. Advantageously, substrate influences and also thermo-mechanical stresses can be reduced by the flexible regions of the respective layers.

Advantageously, known methods of microelectronics or microsystem technology can be used for many embodiments of the invention, such as, for example, thin film methods, lithographic methods, etching methods, laser ablation methods and others. These methods can advantageously be combined in a single process method, as a result of which the complexity of the proposed production method can be significantly reduced compared to conventional production methods.

LIST OF REFERENCE SYMBOLS

100; 500; 600; 700; 800; 900; 1000 carrier arrangement
110; 510; 610; 710; 810; 910; 1010 carrier; substrate
711; 1011 first carrier segment
712; 1012 second carrier segment
715; 815 further carrier; substrate
120; 520; 620; 720; 820; 920; 1020 surface
121; 521; 621; 721; 821; 921; 1021 first surface region
122; 722; 922 second surface region
130; 530; 630; 730; 830; 930; 1030 layer
131; 531; 631; 731; 831; 931; 1031 first region
132; 532; 632; 732; 832; 932; 1032 second region
133, 134 partial layer
135; 535; 635; 735; 835 curved region
136; 536; 636; 736; 836 flat region
150; 550; 650; 850 component
760; 860; 960; 1060 contact element
761; 861; 961; 1061 plated-through hole
570; 970; 1070 line
880 connection element

The invention claimed is:

1. A method for producing a carrier arrangement, the method comprising:
producing a layer on a surface of a carrier, the layer comprising a first region and a second region connected to the first region, the first region covering a first surface region of the carrier and the second region covering a second surface region of the carrier; and
detaching the second region of the layer from the carrier, the first region of the layer remaining on the first surface region of the carrier and not being separated from the second region, the layer being flexible in the detached second region, wherein, before production of the layer on the surface of the carrier:
an intermediate layer which reinforces an adhesive force is applied on the first surface region of the carrier, wherein the second surface region is left out or the intermediate layer which reinforces the adhesive force is removed from the second surface region of the carrier again before the layer is produced on the surface of the carrier, wherein the intermediate layer which reinforces the adhesive force is formed from only one layer of atoms or molecules of a material of the intermediate layer which reinforces the adhesive force; or
an intermediate layer which reduces an adhesive force is applied on the second surface region of the carrier, wherein the first surface region is left out or the intermediate layer which reduces the adhesive force is removed from the first surface region of the carrier again before the layer is produced on the surface of the carrier, wherein the intermediate layer which reduces the adhesive force is formed from only one layer of atoms or molecules of a material of the intermediate layer which reduces the adhesive force.

2. The method according to claim 1, wherein the second region of the layer detached from the carrier is bent or folded.

3. The method according to claim 1, wherein the second region detached from the carrier is connected to a further carrier of the carrier arrangement.

4. The method according to claim 1, wherein, before or after the second region of the layer is detached from the carrier, the carrier is severed in at least one of the second surface region or between the first surface region and the second surface region without separating the first region of the layer from the second region of the layer.

5. The method according to claim 1, wherein, before the second region of the layer is detached from the carrier, adhesion of the second region of the layer to the second surface region is reduced by irradiating at least one of the second surface region of the carrier or the second region of the layer adhering to the second surface region with electromagnetic radiation through the carrier.

6. The method according to claim 1, wherein the second region of the layer is detached from the carrier by etching a region of the carrier which forms the first surface region of the carrier.

7. The method according to claim 1, wherein at least a portion of the carrier is formed from at least one of silicon, glass, metal, ceramic or a polymer.

8. The method according to claim 1, wherein the carrier is a wafer, part of a wafer, a plate or a band.

9. The method according to claim 1, wherein at least a portion of the layer is formed from at least one of a polymer from a metal, from glass from silicon.

10. The method according to claim 1, wherein the layer has a total thickness between 1 and 300 μm.

11. The method according to claim 1, wherein during the production of the layer on the surface of the carrier, at least one insulating layer of the layer is formed from an electrically insulating material, wherein the at least one insulating layer covers at least the first surface region and the second surface region of the carrier, wherein at least one conductive layer made of an electrically conductive material is formed on the at least one insulating layer, wherein the at least one conductive layer comprises at least one conductor track.

12. The method according to claim 11, wherein the at least one conductive layer comprises at least one continuous conductor track which, starting from the first region of the layer, extends into the second region of the layer.

13. The method according to claim 11, wherein at least one electrical contact element is located on the surface of the carrier within the first surface region, wherein an electrical connection is established between the at least one electrical contact element and the at least one conductor track of the layer.

14. The method according to claim 13, wherein the at least one electrical contact element, starting from the first surface region of the carrier, at least partially extends through the first region of the layer.

15. The method according to claim 13, wherein the at least one electrical contact element is connected in an electrically conductive manner to at least one of a conductor track located on the carrier or to an electronic component located on the carrier.

16. The method according to claim 1, wherein at least one electrical contact element and/or at least one electronic component is located on at least one of the first region or on the second region of the layer or is integrated in at least one of the first region or in the second region of the layer.

17. The method according to claim 1, wherein the intermediate layer is the intermediate layer which reinforces the adhesive force.

18. The method according to claim 1, wherein the intermediate layer is the intermediate layer which reduces the adhesive force.

* * * * *